United States Patent
Vindasius et al.

(10) Patent No.: US 7,705,432 B2
(45) Date of Patent: Apr. 27, 2010

(54) THREE DIMENSIONAL SIX SURFACE CONFORMAL DIE COATING

(75) Inventors: Al Vindasius, Saratoga, CA (US); Marc Robinson, San Jose, CA (US)

(73) Assignee: Vertical Circuits, Inc., Scotts Valley, CA (US)

( * ) Notice: Subject to any disclaimer, the term of this patent is extended or adjusted under 35 U.S.C. 154(b) by 122 days.

(21) Appl. No.: 11/016,558

(22) Filed: Dec. 17, 2004

(65) Prior Publication Data

US 2005/0224952 A1 Oct. 13, 2005

Related U.S. Application Data

(60) Provisional application No. 60/561,847, filed on Apr. 13, 2004.

(51) Int. Cl.
*H01L 23/58* (2006.01)
(52) U.S. Cl. ............... 257/642; 257/594; 257/622; 257/E23.002
(58) Field of Classification Search ............ 257/701, 257/787, 632, 713, E23.133, 594, 622, 642; 438/465, 958, 15, 26, 113
See application file for complete search history.

(56) References Cited

U.S. PATENT DOCUMENTS

| | | | |
|---|---|---|---|
| 3,648,131 A | 3/1972 | Stuby | |
| 3,679,941 A | 7/1972 | LaCombe et al. | |
| 3,702,025 A | 11/1972 | Archer | |
| 4,074,342 A | 2/1978 | Honn et al. | |
| 4,323,914 A * | 4/1982 | Berndlmaier et al. | 257/713 |
| 4,525,921 A | 7/1985 | Carson et al. | |
| 4,545,840 A | 10/1985 | Newman et al. | |
| 4,646,128 A | 2/1987 | Carson et al. | |
| 4,659,931 A | 4/1987 | Schmitz et al. | |

(Continued)

FOREIGN PATENT DOCUMENTS

EP 0314437 5/1989

(Continued)

OTHER PUBLICATIONS

European Search Report relating to EP Application No. 05735136.3 dated Jun. 5, 2008.

(Continued)

*Primary Examiner*—Wai-Sing Louie
(74) *Attorney, Agent, or Firm*—Bill Kennedy; Haynes Beffel & Wolfeld LLP

(57) ABSTRACT

Semiconductor die are typically manufactured as a large group of integrated circuit die imaged through photolithographic means on a semiconductor wafer or slice made of silicon. After manufacture, the silicon wafer is thinned, usually by mechanical means, and the wafer is cut, usually with a diamond saw, to singulate the individual die. The resulting individual integrated circuit has six exposed surfaces. The top surface of the die includes the circuitry images and any passivation layers that have been added to the top layer during wafer fabrication. The present invention describes a method for protecting and insulating all six surfaces of the die to reduce breakage, provide electrical insulation for these layers, and to provide physical surfaces that can be used for bonding one semiconductor die to another for the purpose of stacking die in an interconnected module or component.

5 Claims, 5 Drawing Sheets

U.S. PATENT DOCUMENTS

| | | | |
|---|---|---|---|
| 4,672,737 A | 6/1987 | Carson et al. | |
| 4,703,170 A | 10/1987 | Schmitz | |
| 4,706,166 A | 11/1987 | Go | |
| 4,761,681 A | 8/1988 | Reid | |
| 4,764,846 A | 8/1988 | Go | |
| 4,801,992 A | 1/1989 | Golubic | |
| 4,807,021 A | 2/1989 | Okumura | |
| 4,818,823 A | 4/1989 | Bradley | |
| 4,827,327 A | 5/1989 | Miyauchi et al. | |
| 4,862,249 A | 8/1989 | Carlson | |
| 4,894,706 A | 1/1990 | Sato et al. | |
| 4,897,708 A | 1/1990 | Clements | |
| 4,901,136 A | 2/1990 | Neugebauer et al. | |
| 4,939,568 A | 7/1990 | Kato et al. | |
| 4,941,033 A | 7/1990 | Kishida et al. | |
| 4,954,875 A | 9/1990 | Clements | |
| 4,956,694 A | 9/1990 | Eide | |
| 4,956,695 A | 9/1990 | Robinson et al. | |
| 4,959,749 A | 9/1990 | Dzarnoski, Jr. et al. | |
| 4,983,533 A | 1/1991 | Go | |
| 4,996,583 A | 2/1991 | Hatada et al. | |
| 5,006,923 A | 4/1991 | Warren | |
| 5,013,687 A | 5/1991 | Solomon | |
| 5,019,943 A | 5/1991 | Fassbender et al. | |
| 5,025,306 A | 6/1991 | Johnson et al. | |
| 5,028,986 A | 7/1991 | Sugano et al. | |
| 5,032,896 A | 7/1991 | Little et al. | |
| 5,075,253 A | 12/1991 | Sliwa, Jr. | |
| 5,093,708 A | 3/1992 | Solomon | |
| 5,104,820 A | 4/1992 | Go et al. | |
| 5,111,278 A | 5/1992 | Eichelberger | |
| 5,117,282 A | 5/1992 | Salatino | |
| 5,128,831 A | 7/1992 | Fox, III et al. | |
| 5,135,556 A | 8/1992 | Hornback et al. | |
| 5,138,437 A | 8/1992 | Kumamoto et al. | |
| 5,146,308 A | 9/1992 | Chance et al. | |
| 5,172,303 A | 12/1992 | Bernardoni et al. | |
| 5,191,405 A | 3/1993 | Tomita et al. | |
| 5,198,888 A | 3/1993 | Sugano et al. | |
| 5,202,754 A | 4/1993 | Bertin et al. | |
| 5,221,642 A | 6/1993 | Burns | |
| 5,222,014 A | 6/1993 | Lin | |
| 5,229,647 A | 7/1993 | Gnadinger | |
| 5,231,304 A | 7/1993 | Solomon | |
| 5,247,423 A | 9/1993 | Lin et al. | |
| 5,258,330 A | 11/1993 | Khandros et al. | |
| 5,270,261 A | 12/1993 | Bertin et al. | |
| 5,270,571 A | 12/1993 | Parks et al. | |
| 5,279,029 A | 1/1994 | Burns | |
| 5,309,326 A | 5/1994 | Minoru et al. | |
| 5,311,401 A | 5/1994 | Gates, Jr. et al. | |
| 5,313,096 A | 5/1994 | Eide | |
| 5,330,359 A | 7/1994 | Walker | |
| 5,420,751 A | 5/1995 | Burns | |
| 5,422,435 A | 6/1995 | Takiar et al. | |
| 5,434,745 A | 7/1995 | Shokrgozar et al. | |
| 5,445,994 A | 8/1995 | Gilton | |
| 5,446,620 A | 8/1995 | Burns et al. | |
| 5,479,318 A | 12/1995 | Burns | |
| 5,493,476 A | 2/1996 | Burns | |
| 5,495,398 A | 2/1996 | Takiar et al. | |
| 5,499,160 A | 3/1996 | Burns | |
| 5,502,289 A | 3/1996 | Takiar et al. | |
| 5,502,333 A | 3/1996 | Bertin et al. | |
| 5,538,758 A * | 7/1996 | Beach et al. | 427/255.6 |
| 5,550,711 A | 8/1996 | Burns et al. | |
| 5,552,963 A | 9/1996 | Burns | |
| 5,566,051 A | 10/1996 | Burns | |
| 5,600,541 A | 2/1997 | Bone et al. | |
| 5,625,230 A | 4/1997 | Park et al. | |
| 5,657,206 A | 8/1997 | Pedersen et al. | |
| 5,675,180 A | 10/1997 | Pedersen et al. | |
| 5,688,721 A | 11/1997 | Johnson | |
| 5,696,031 A | 12/1997 | Wark | |
| 5,698,895 A | 12/1997 | Pedersen et al. | |
| 5,724,230 A | 3/1998 | Poetzinger | |
| 5,870,351 A * | 2/1999 | Ladabaum et al. | 367/163 |
| 5,891,761 A | 4/1999 | Vindasius et al. | |
| 5,936,302 A | 8/1999 | Pedersen et al. | |
| 5,994,170 A | 11/1999 | Pedersen et al. | |
| 6,080,596 A | 6/2000 | Vindasius et al. | |
| 6,098,278 A | 8/2000 | Vindasius et al. | |
| 6,107,164 A * | 8/2000 | Ohuchi | 438/465 |
| 6,124,633 A | 9/2000 | Vindasius et al. | |
| 6,134,118 A | 10/2000 | Pedersen et al. | |
| 6,255,726 B1 | 7/2001 | Vindasius et al. | |
| 6,271,598 B1 | 8/2001 | Vindasius et al. | |
| 6,297,657 B1* | 10/2001 | Thiessen et al. | 324/761 |
| 6,303,977 B1* | 10/2001 | Schroen et al. | 257/635 |
| 6,338,980 B1* | 1/2002 | Satoh | 438/106 |
| 6,351,030 B2 | 2/2002 | Havens et al. | |
| 6,664,616 B2 | 12/2003 | Tsubosaki et al. | |
| 6,667,543 B1 | 12/2003 | Chow et al. | |
| 6,674,159 B1* | 1/2004 | Peterson et al. | 257/680 |
| 6,844,623 B1* | 1/2005 | Peterson et al. | 257/723 |
| 6,908,784 B1* | 6/2005 | Farnworth et al. | 438/106 |
| 6,940,022 B1* | 9/2005 | Vinciarelli et al. | 174/256 |
| 6,956,283 B1* | 10/2005 | Peterson | 257/680 |
| 6,964,915 B2* | 11/2005 | Farnworth et al. | 438/460 |
| 6,973,718 B2* | 12/2005 | Sheppard et al. | 29/846 |
| 6,984,885 B1 | 1/2006 | Harada et al. | |
| 7,029,949 B2* | 4/2006 | Farnworth et al. | 438/113 |
| 7,091,592 B2 | 8/2006 | Chen et al. | |
| 7,215,018 B2 | 5/2007 | Vindasius et al. | |
| 7,245,021 B2 | 7/2007 | Vindasius et al. | |
| 2002/0096349 A1* | 7/2002 | Hedler et al. | 174/52.4 |
| 2002/0168798 A1 | 11/2002 | Glenn et al. | |
| 2002/0180010 A1 | 12/2002 | Tsubosaki et al. | |
| 2002/0185725 A1 | 12/2002 | Moden et al. | |
| 2002/0187260 A1 | 12/2002 | Sheppard et al. | |
| 2003/0099085 A1* | 5/2003 | Duva | 361/311 |
| 2004/0113283 A1* | 6/2004 | Farnworth et al. | 257/782 |
| 2004/0238933 A1 | 12/2004 | Chen et al. | |
| 2005/0082651 A1* | 4/2005 | Farnworth et al. | 257/678 |

FOREIGN PATENT DOCUMENTS

| | | |
|---|---|---|
| EP | 1763894 A0 | 10/2005 |
| JP | 63056925 | 3/1988 |
| JP | 1035528 | 2/1989 |
| JP | 02133936 | 5/1990 |
| WO | WO-9323982 | 11/1993 |
| WO | WO-9909599 | 2/1999 |
| WO | WO-0164344 | 9/2001 |

OTHER PUBLICATIONS

Jun. 27, 2008 Amendment filed in repsonse to Office Action mailed Mar. 27, 2008, U.S. Appl. No. 11/106,558.

Office Action mailed Feb. 7, 2006, U.S. Appl. No. 11/097,829.

Aug. 27, 2006 Amendment filed in response to Office Action mailed Feb. 7, 2006, U.S. Appl. No. 11/097,829.

Final Office Action, mailed Jan. 8, 2007, U.S. Appl. No. 11/087,829.

Amendment filed in response to Final Office Action mailed Jan. 8, 2007, U.S. Appl. No. 11/097,829.

* cited by examiner

THREE DIMENSIONAL SIX SURFACE CONFORMAL DIE COATING

CROSS REFERENCE TO RELATED APPLICATIONS

The present application is related to provisional patent application Ser. No. 60/561,847, filed Apr. 13, 2004 entitled "Three Dimensional Six Surface Conformal Die Coating", the details of which are hereby incorporated by reference, and the benefit of the earlier Apr. 13, 2004 filing date is claimed in accordance with 35 USC 119 (e) (1).

BACKGROUND AND SUMMARY OF THE PRESENT INVENTION

Semiconductor die are typically manufactured as a large group of integrated circuit die imaged through photolithographic means on a semiconductor wafer or slice made of silicon. After manufacture, the silicon wafer is thinned, usually by mechanical means, and the wafer is cut, usually with a diamond saw, to singulate the individual die. The resulting individual integrated circuit has six exposed surfaces. The top surface of the die includes the circuitry images and any passivation layers that have been added to the top layer during wafer fabrication. The present invention describes a method for protecting and insulating all six surfaces of the die to reduce breakage, provide electrical insulation for these layers, and to provide physical surfaces that can be used for bonding one semiconductor die to another for the purpose of stacking die in an interconnected module or component.

The present invention provides the advantages of reducing chipping, cracking, and physical damage to die during die handling and processing operations such as burn-in, test, and assembly. The present invention is useable for any semiconductor chips including, but not limited to memory chips.

DETAILED DESCRIPTION OF THE INVENTION

Figure 1:
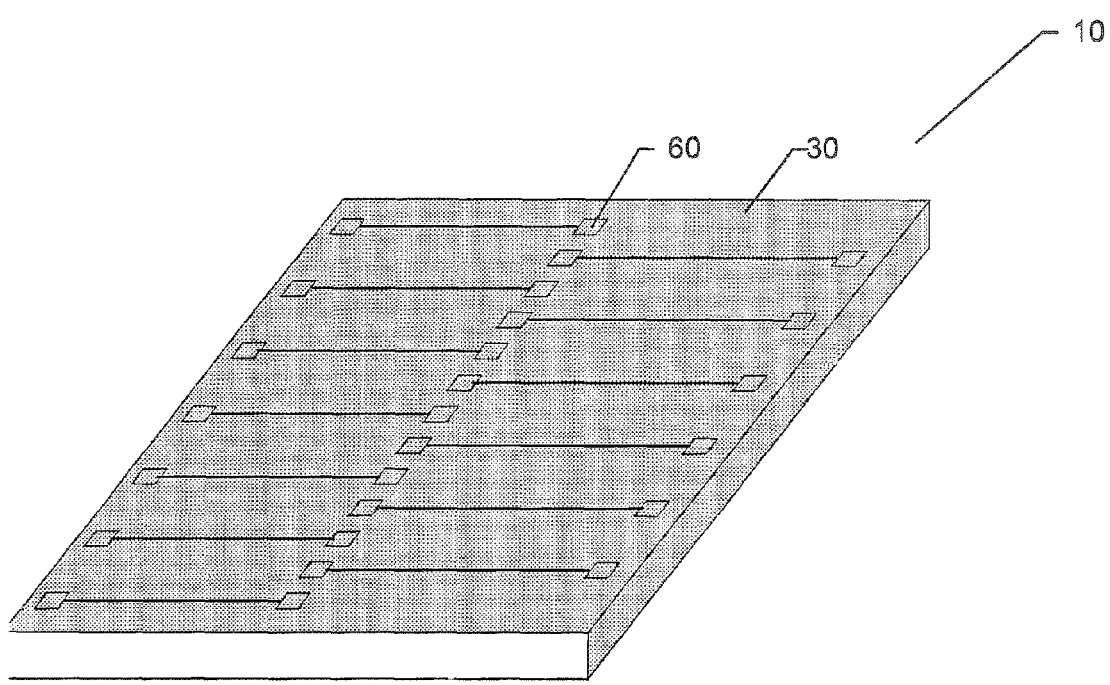
FIG. 1 is a diagram illustrating a single semiconductor die with original connection pads running down the center of the die, and rerouting lines connecting the original connection pads at the center of the die with new connection pads located at the edges of the die.

Referring to FIG. 1, semiconductor die 10, with original connection pads 60 have had an insulating layer applied to the top surface, 30 of all of the die while the die are still connected together in a wafer form. A metal layer is deposited and defined using photolithography, to reroute the electrical signals from the original connection pads 60 to new locations at the edge of the die. An additional layer of insulating material is optionally applied above the metal layer, and openings are made in the top layer of insulating material at the relocated pad locations at the edge of the semiconductor die, and optionally at the original pad locations down the center of the top surface of the die.

Figure 2:
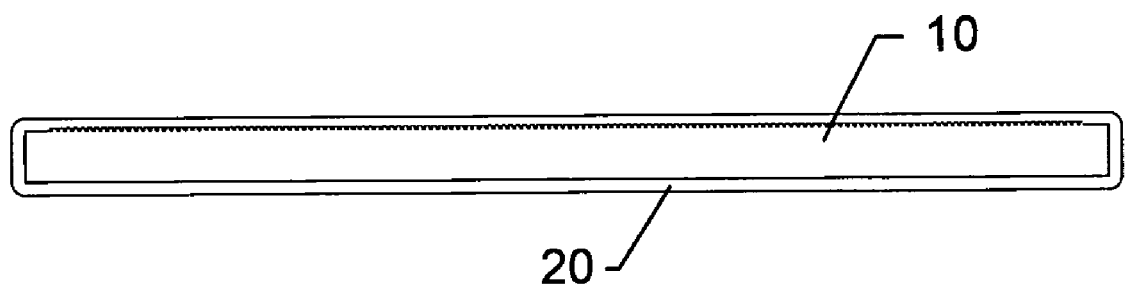
FIG. 2 is a diagram illustrating a cross sectional side view of a semiconductor die showing the die coated with a conformal, insulating coating.

Referring to FIG. 2, the semiconductor die, 10, has been thinned by grinding or lapping, and has been singulated from the semiconductor wafer, and said semiconductor die has been coated with a conformal insulating coating 20.

Figure 3:
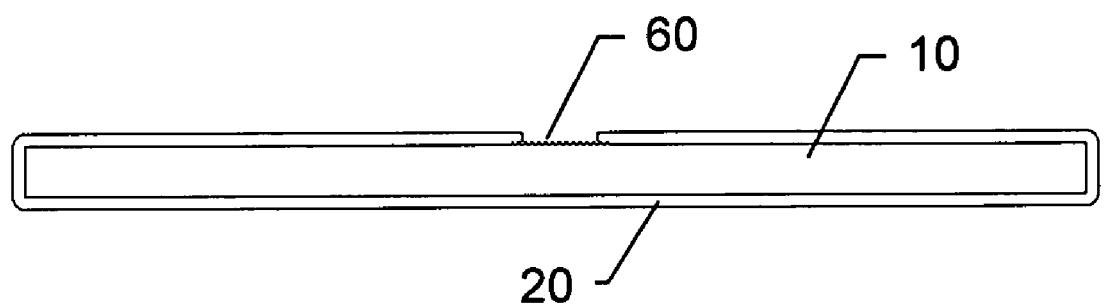
FIG. 3 is a diagram illustrating a cross section view of the semiconductor die showing the conformal coating and openings in the conformal coating above the original connection pads which run down the center of the semiconductor die.

Referring to FIG. 3, openings have been made in the coating, 20, above original connection pads, 60, of semiconductor die, 10. The electrical connection pads in this illustration run down the center of the top surface of the die.

Figure 4:
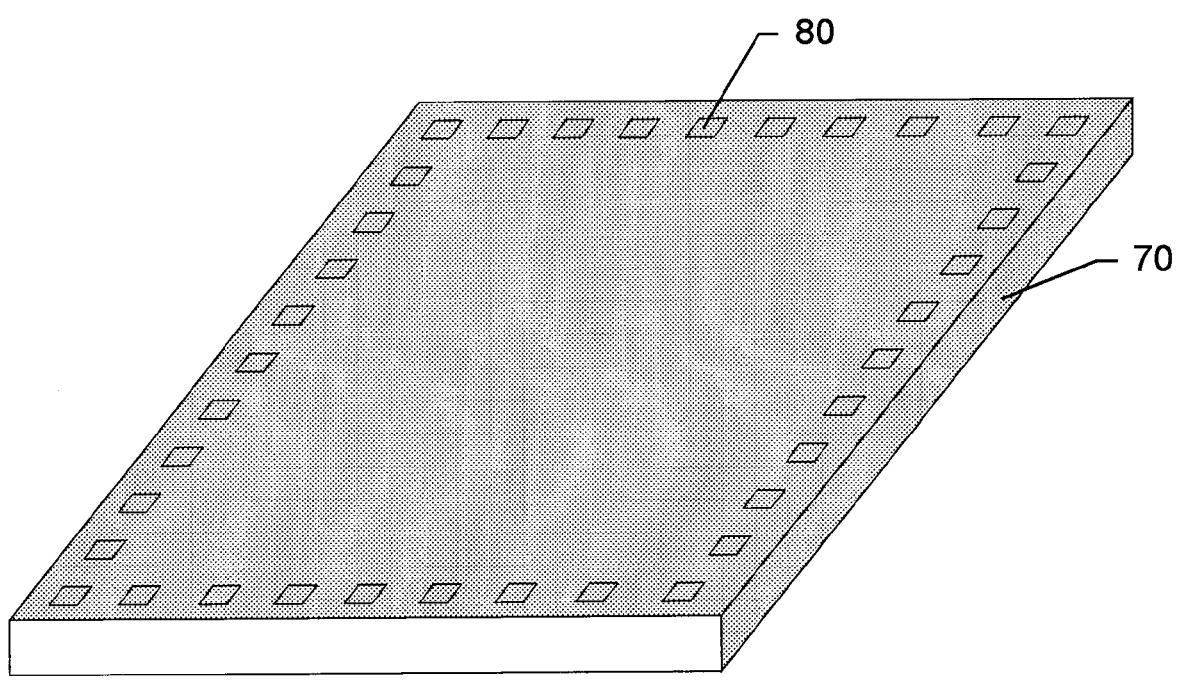
FIG. 4 shows a semiconductor die with connection pads around the periphery of the die.

Referring to FIG. 4, this shows a semiconductor die 70 with connection pads 80 located around the periphery of the die top surface.

Figure 5:
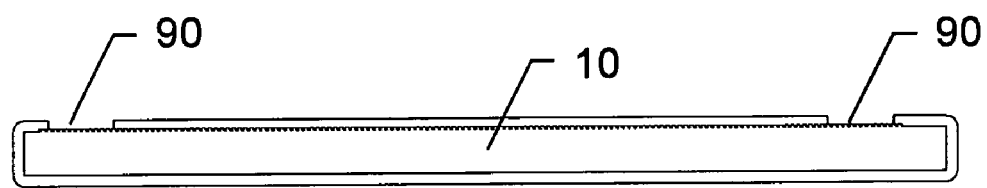
FIG. 5 shows a semiconductor die with peripheral pads, either original or relocated, coated with a conformal insulative coating, and with openings in the insulative coating located above the peripherally located electrical connection pads.

FIG. 5 shows openings in the conformal coating material at locations 90 on a semiconductor die whose electrical connections are located at the edges of the surface of the die. The electrical connection points may be located anywhere on any of the surfaces of the die, but are typically located on the top surface of the die and are typically either at the peripheral edges of the top surface or down the center of the top surface.

What is claimed is:

1. Individual freestanding silicon die, including six surfaces, which have been singulated from a semiconductor wafer, the die being coated on all six surfaces with a parylene film which has been applied to all surfaces; the parylene film providing electrical insulation and serving as a mechanical protection for the surfaces to prevent chipping and cracking of the silicon die.

2. The die as in claim 1 including openings in the parylene film where the parylene film has been removed to expose a specific layer or feature underneath the insulating material.

3. The die as in claim 2 wherein the opening is above electrical connection pads above circuitry on a top surface of the die.

4. The die as in claim 2 wherein the opening is above optical emitters or sensors on a top surface of the die.

5. The die as in claim 2 wherein the openings are formed through the use of a laser to remove, or ablate, the polymer material from above a specific layer or feature.

* * * * *